United States Patent [19]

Schell et al.

[11] Patent Number: 4,579,811

[45] Date of Patent: Apr. 1, 1986

[54] PROCESS FOR DEVELOPING EXPOSED DIAZO NEGATIVE-WORKING REPRODUCTION LAYERS USING AQUEOUS DEVELOPER HAVING SALT OF AROMATIC CARBOXYLIC ACID WITH ADJACENT GROUP SUBSTITUENT

[75] Inventors: Loni Schell, Hofheim-Wallau; Werner Frass, Wiesbaden; Inge Gros, Taunusstein, all of Fed. Rep. of Germany

[73] Assignee: Hoechst Aktiengesellschaft, Frankfurt am Main, Fed. Rep. of Germany

[21] Appl. No.: 566,395

[22] Filed: Dec. 28, 1983

Related U.S. Application Data

[62] Division of Ser. No. 425,389, Sep. 28, 1982, abandoned.

[30] Foreign Application Priority Data

Oct. 9, 1981 [DE] Fed. Rep. of Germany ....... 3140186

[51] Int. Cl.$^4$ .......................... G03F 7/08; G03F 7/26; G03C 5/34
[52] U.S. Cl. .................................. 430/302; 430/149; 430/158; 430/159; 430/160; 430/161; 430/175; 430/176; 430/275; 430/276; 430/278; 430/309; 430/331; 430/325
[58] Field of Search ................ 430/309, 325, 302, 149

[56] References Cited

U.S. PATENT DOCUMENTS

| 3,201,241 | 8/1965 | Munder et al. | 430/331 |
| 3,867,147 | 2/1975 | Teuscher | 430/175 |
| 3,891,439 | 6/1975 | Katz et al. | 430/330 |
| 4,147,545 | 4/1979 | Rowe et al. | 430/154 |
| 4,287,297 | 9/1981 | Ishihara et al. | 430/331 |
| 4,329,422 | 5/1982 | Langlais | 430/331 |
| 4,350,756 | 9/1982 | Burch et al. | 430/331 |

FOREIGN PATENT DOCUMENTS 1603700 11/1981 United Kingdom ............... 430/149

Primary Examiner—Charles L. Bowers, Jr.
Attorney, Agent, or Firm—Schwartz, Jeffery, Schwaab, Mack, Blumenthal & Evans

[57] ABSTRACT

Disclosed is a developer composition for exposed, light-sensitive, negative-working reproduction layers, which may contain an organic binder, comprising water and a salt of a substituted aromatic carboxylic acid, in particular, from about 5 to 60% by weight of at least one salt of an aromatic carboxylic acid having substituents which are immediately adjacent to the carboxyl group and represent an amino group, a hydroxyl group, and/or chlorine or bromine. Also disclosed is a process for developing the reproduction layers utilizing the disclosed developers, wherein the reproduction layer contains, in particular, a polymeric organic binder with an acetal, anhydride, amide and/or a carboxyl group.

12 Claims, No Drawings

PROCESS FOR DEVELOPING EXPOSED DIAZO NEGATIVE-WORKING REPRODUCTION LAYERS USING AQUEOUS DEVELOPER HAVING SALT OF AROMATIC CARBOXYLIC ACID WITH ADJACENT GROUP SUBSTITUENT

This is a division of application Ser. No. 425,389 filed Sept. 28, 1982, abandoned.

BACKGROUND OF THE INVENTION

The present invention relates to a developer which is suitable for developing negative-working exposed reproduction layers which may also contain an organic binder.

Light-sensitive reproduction layers are used, for example, in the preparation of offset printing forms or of photoresists (below, both these are called copying materials), that is to say they are in general applied by the user or the industrial manufacturer to a support. The supports used in these copying materials are metals, such as zinc, magnesium, chromium, copper, brass, steel, silicon, aluminum or combinations of these metals, plastic films, paper or similar materials. These supports can be coated with the light-sensitive reproduction layer without any modifying pretreatment, but preferably they are coated after carrying out a surface modification, such as mechanical, chemical and/or electrochemical roughening, an oxidation and/or a treatment with agents rendering the surface hydrophilic (for example, in the case of supports for offset printing plates). In addition to at least one light-sensitive compound, the conventional reproduction layers contain in most cases also an organic binder (resins or the like) and, optionally, also plasticizers, pigments, dyes, wetting agents, sensitizers, adhesion-promoters, indicators and other customary auxiliaries. After they have been exposed, the reproduction layers are developed in order to produce an image from them. For example, a printing form or a photoresist is obtained in this way.

A developer for negative-working reproduction layers must be capable of dissolving those parts of the layer (the later non-image areas) which have not been struck by electromagnetic radiation (e.g., light) away from the exposed layer without substantially affecting those parts of the layer (the later image areas) which have been struck by the radiation. In German Offenlegungsschrift No. 2,065,732 (=U.S. Pat. No. 3,867,147) which can be mentioned as a representative example, the following are listed as examples of suitable developers: water, water/organic solvent mixtures, aqueous salt solutions, aqueous acid solutions, aqueous-alkaline solutions and undiluted organic solvents, to which, if appropriate, surfactants and/or agents for rendering the surface hydrophilic can be added. The developers primarily used in the examples of this publication contain water, sodium lauryl-sulfate, sodium sulfate, tartaric acid and in some cases benzyl alcohol. Other developers contain, or are composed of, isopropanol, n-propanol, n-propyl acetate, polyacrylic acid, 1,1,1-trichloroethane, acetone or ethylene glycol monomethyl ether. As a rule, the most effective developers for such negative-working reproduction layers, however, have hitherto contained surfactants, so that foaming of the developer occurs, in particular in the case of developing in a machine.

In addition to the developer components already mentioned, the following have also been disclosed in the state of the art:

In German Auslegeschrift No. 1,193,366 (=U.S. Pat. No. 3,201,241), an aqueous developer for positive-working reproduction layers is described, which also contains complex formers and/or hydrophilic polymers in addition to a component having an alkaline reaction and a cation such as $Be^{2+}$, $Hg^{2+}$, $Ca^{2+}$, $Sr^{2+}$, $Ba^{2+}$, $Bi^{3+}$ or $La^{3+}$ (the anions mentioned also include, inter alia, those of aliphatic carboxylic acids). In a relatively large list of compounds, salicylic acid (2-hydroxybenzoic acid) is also mentioned as a complex former. The developers should have pH values from 10.5 to 12.2, preferably from 10.9 to 11.5. The complex formers should be present in the developer in a quantity from 0.001 to 0.25% by weight, preferably from 0.07 to 0.1% by weight.

From German Offenlegungsschrift No. 2,353,992 (=U.S. Pat. No. 4,147,545), an aqueous developer for negative-working or positive-working reproduction layers is known, which contains a lithium salt of an acidic organic compound and/or an amphoteric surfactant. In an extensive listing, lithium benzoate, lithium naphthenate and lithium acetylsalicylate are also mentioned, inter alia, as suitable lithium salts.

The process for developing positive-working or negative-working reproduction layers according to German Offenlegungsschrift No. 2,504,130 is carried out at temperatures from 35° to 80° C. with developers, the components of which have a boiling point (b.p.$_{760}$) higher than 80° C. The developer can, inter alia, contain an organic solvent, a component having an alkaline reaction, an anionic or nonionic surfactant, water and/or an antifoaming agent, which, inter alia, is also to include benzoic acid in a proportion of 0.1 to 5% by weight.

German Offenlegungsschrift No. 2,934,897 (=WO-OS No. 79/00,593) describes a desensitization solution for negative-working reproduction layers, which contains (a) 2 to 50% by weight of a substituted benzoic acid, a substituted benzenesulfonic acid or benzenephosphonic acid or of a corresponding salt of these acids and (b) 5 to 60% by weight of a filmformer selected from the group comprising aliphatic polyols, monoesters or alkali metals salts thereof. As suitable components (a), sodium benzoate, 4-hydroxybenzoic acid or the potassium or sodium salt of 4-aminobenzoic acid are mentioned. The desensitization solution is said to also be suitable as a developer for the above-mentioned layers.

European Patent Application No. 0,033,232 discloses a developer for negative-working reproduction layers, which contains (a) 20 to 300 g/l of a salt of an aliphatic carboxylic acid having up to 9 C atoms, (b) a non-ionic surfactant and, if appropriate, (c) 20 to 300 g/l of a salt of an aromatic carboxylic acid. Salts of benzoic acid or toluenecarboxylic acid are mentioned as a suitable component (c).

Many of the known developers have, however, either the disadvantage of a relatively high pH value, as a result of which, for example, the aluminum oxide layers present on many printing plate support materials can be attacked, or they contain organic solvents, so that developing in a manner which does not pollute the environment is not ensured in the optimum manner. The hitherto disclosed salts of aliphatic or aromatic carboxylic acids can admittedly develop some reproduction layers, but problems arise, in particular in the case of layers containing binders. Although the addition of certain surfactants can assist the developing process, and this applies in particular to reproduction layers which are to be developed by hand or in troughs, foaming effects frequently occur when these developers are used in automatic developing machines.

SUMMARY OF THE INVENTION

It is therefore an object of the present invention to provide an improved aqueous developer for negative-working reproduction layers.

A further object of the invention resides in providing an aqueous developer for negative-working reproduction layers, which does not require any additions of organic solvents, which is suitable even for layers containing organic binders and which has only a slight tendency to foam or no tendency to foam at all.

It is also an object of the present invention to provide a process for developing negative-working reproduction layers, particularly those which contain an organic binder.

In accomplishing the foregoing objects, there has been provided in accordance with one aspect of the present invention a developer composition for exposed, light-sensitive negative-working reproduction layers which optionally contain an organic binder, comprising water and from about 5 to 60% by weight of at least one salt of a substituted aromatic carboxylic acid, wherein the substituents of the carboxylic acid are immediately adjacent to the carboxyl group and represent an amino group, a hydroxyl group and/or chlorine or bromine.

In accordance with another aspect of the present invention, there has been provided a process for developing an exposed, negative-working reproduction layer which optionally contains an organic binder comprising the steps of treating the reproduction layer with a developer composition as defined above.

Further objects, features and advantages of the present invention will become apparent from the detailed description of preferred embodiments which follows.

DETAILED DESCRIPTION OF PREFERRED EMBODIMENTS

The present invention is an improvement over known developers for exposed light-sensitive, negative-working reproduction layers which may contain an organic binder. The developer according to the invention comprises from about 5 to 60% by weight of at least one salt of a substituted aromatic carboxylic acid, the substitutents of which are immediately adjacent to the carboxyl group and represent an amino group, a hydroxyl group and/or chlorine or bromine.

In a preferred embodiment, the developer according to the invention contains from about 10 to 30% by weight of the said salt(s). Suitable salts include those of monocarboxylic acids, in particular of 2-hydroxybenzoic acid (=salicylic acid), 2-aminobenzoic acid (=anthranilic acid), 2-chlorobenzoic acid, 2,6-dihydroxybenzoic acid and of 2-hydroxynaphthalene-3-carboxylic acid. The possible cations for these salts, which should be water-soluble, if possible, are especially $Na^+$ ions, $NH_4^+$ ions or $K^+$ ions, and also cations derived from organic amines, such as ethanolamines or ethylenediamine.

As further components which, however, are not absolutely necessary for the fundamental developing effect of the developer according to the invention, the aqueous developer can also contain non-ionic and especially anionic surfactants in a quantity from about 0.01 to 10% by weight, and auxiliaries, such as complex formers (sequestering agents) or antifoaming agents, complex formers in a quantity from about 0.1 to 15% by weight, and antifoaming agents in a quantity from about 0.01 to 2% by weight. Alkali metal salts or ammonium salts of sulfuric acid monoalkyl esters with alkyl groups of $C_7$ to $C_{14}$ have been found to be particularly suitable surfactants which can, in part, serve to smooth out and accelerate the developing step. Complex formers which, for example, can prevent polyvalent cations (for example, $CA^{2+}$) which may occur in the water, from exerting an adverse effect (formation of "lime soaps") on the salts of the substituted aromatic carboxylic acids, include especially phosphates (for example, polyphosphates), but other complex formers, such as citric acid or ethylenediaminetetraacetic acid, are also possible. The pH value of the developer according to the invention generally ranges between about 7 and 13, preferably between about 7 and 11. To adjust the pH value in the case of already given salts of the substituted aromatic carboxylic acid and/or to convert a given acid into the corresponding salt forms, the most diverse compounds having a basic reaction can be used, in a quantity from about 0.1 to 20% by weight, said quantity especially depending upon the kind of auxiliary and/or the kind of substituted aromatic carboxylic acid and its given acid, respectively. These compounds include especially the aqueous solutions of alkali metal hydroxides, ethanolamines, ethylenediamine, alkali metal phosphates or alkali metal polyphosphates.

Another achievement according to the invention is a process for developing negative-working reproduction layers, by treating the exposed reproduction layer, which may contain an organic binder, with a developer based on water and a salt of a substituted aromatic carboxylic acid. The process according to the invention comprises treating the reproduction layer with an aqueous developer which contains the salts listed above. In particular, the process is used for developing those reproduction layers which contain a polymeric organic binder with acetal, anhydride, amide (in particular urethane) and/or carboxyl groups and/or contain a diazonium salt polycondensation product as the light-sensitive compound. These binders include, for example, copolymers of styrene and maleic anhydride, polyvinyl butyrals, polyvinyl formals, reaction products of polymeric polyhydroxyl compounds and sulfonyl isocyanates, copolymers of methyl methacrylate and methacrylic acid, or urea resins.

The developers according to the invention are also suitable for cleanly and fully developing negative-working reproduction layers containing polymeric organic binders, without an attack on the image areas, or penetration of the developer underneath the image areas, taking place. Moreover, no major environmental problems arise, for example, due to the working-up of organic solvent fractions by distillation, and the developers according to the invention can also be used in automatic processing machines, at least without significant foam appearing. The developers can also be used even at pH values which are close to the neutral point.

The reproduction layer to be developed is present especially as a part (light-sensitive layer) of an offset printing plate or as a resist applied to a support material (photoresist layer). Examples of the possible support material are those based on zinc, chromium, magnesium, copper, brass, steel, silicon, aluminum or combinations of these metals, or plastic films, paper or materials comparable therewith. These can be provided with a suitable reproduction layer without a special modifying pretreatment, but preferably this coating is carried out only after a surface modification, such as mechanical, chemical or electrochemical roughening, an oxidation and/or a treatment with agents rendering the surface hydrophilic (especially in the case of supports for offest printing plates).

Particularly suitable substrates for the preparation of offset printing plates include those of aluminum or one of its alloys. These include, for example:

"Pure aluminum" (DIN material No. 3.0255), that is to say composed of ≧99.5% of Al and the following permissible impurities of (a maximum of 0.5% in total) 0.3% Si, 0.4% Fe, 0.03% Ti, 0.02% Cu, 0.07% Zn and 0.03% others, or "Al alloy 3003" (comparable with DIN material No. 3.0515), that is to say composed of ≧98.5% Al, 0 to 0.3% Mg and 0.8 to 1.5% Mn as alloy constituents and the following permissible impurities of 0.5% Si, 0.5% Fe, 0.2% Ti, 0.2% Zn, 0.1% Cu and 0.15% others.

The aluminum support materials encountered very frequently in practice for printing plates are in general also roughened mechanically (for example, by brushing and/or treatment with abrasive agents), chemically (for example, by etching) or electrochemically (for example, by treatment with alternating current in aqueous HCl or $HNO_3$ solutions), before the light-sensitive layer is applied. The mean peak-to-valley height $R_z$ of the roughened surface is in this case in the range from about 1 to 15 μm, in particular in the range from about 4 to 8 μm.

The peak-to-valley height is determined in accordance with DIN 4,768, October 1970 version, and the peak-to-valley height $R_z$ is then the arithmetic mean of the individual peak-to-valley heights of five mutually adjacent individual measuring lengths.

The preferred electrochemical roughening process is then followed by an anodic oxidation of the aluminum in a further process stage which, if appropriate, can be used, for example, in order to improve the wear and the adhesion properties of the surface of the support material. For the anodic oxidation, the customary electrolytes, such as $H_2SO_4$, $H_3PO_4$, $H_2C_2O_4$, amidosulfonic acid, sulfosuccinic acid, sulfosalicylic acid or mixtures thereof can be used. For example, reference is made to the following standard methods for the use of aqueous electrolytes containing $H_2SO_4$ for the anodic oxidation of aluminum (in this context see, for example, M. Schenk, Werkstoff Aluminium und seine anodische Oxydation (Aluminum as a Material and Its Anodic Oxidation), Francke Verlag—Bern, 1948, page 760; Praktische Galvanotechnik (Electroplating in Practice), Eugen G. Leuze Verlag—Saulgau, 1970, pages 395 et seq. and pages 518/519; W. Huebner and C.T. Speiser, Die Praxis der anodischen Oxidation des Aluminiums (Anodic Oxidation of Aluminum In Practice), Aluminium Verlag—Düsseldorf, 1977, 3rd edition, pages 137 et seq.):

The direct current-sulfuric acid process in which the anodic oxidation is carried out in an aqueous electrolyte composed usually of about 230 g of $H_2SO_4$ per liter of solution at 10° to 22° C. and at a current density of 0.5 to 2.5 A/dm². The sulfuric acid concentration in the aqueous electrolyte solution can in this case also be reduced to 8 to 10% by weight of $H_2SO_4$ (about 100 g of $H_2SO_4$/l) or even increased to 30% by weight (365 g of $H_2SO_4$/l) and higher.

"Hard anodizing" is carried out with an aqueous electrolyte containing $H_2SO_4$ in a concentration of 166 g of $H_2SO_4$/l (or about 230 g of $H_2SO_4$/l) at an operating temperature of 0° to 5° C., at a current density of 2 to 3 A/dm², a voltage rising from about 25 to 30 V at the start to about 40 to 100 V toward the end of the treatment for a period of 30 to 200 minutes.

In addition to the processes for the anodic oxidation of printing plate support materials already mentioned in the preceding paragraph, the following processes, for example, can also be used: the anodic oxidation of aluminum in an aqueous electrolyte which contains $H_2SO_4$ and an $Al^{3+}$ ion content adjusted to values of more than 12 g/l according to German Offenlegungsschrift No. 2,811,396=U.S. Pat. No, 4,211,619), in an aqueous electrolyte containing $H_2SO_4$ and $H_3PO_4$ (according to German Offenlegungsschrift No. 2,707,810=U.S. Pat. No. 4,049,504) or in an aqueous electrolyte containing $H_2SO_4$, $H_3PO_4$ and $Al^{3+}$ ions (according to German Offenlegungsschrift No. 2,836,803=U.S. Pat. No, 4,229,226). Direct current is preferably used for anodic oxidation, but alternating current or a combination of these types of current (for example, direct current with a superposed alternating current) can also be used. The layer weights of aluminum oxide are within a range from about 1 to 10 g/m², corresponding to a layer thickness of about 0.3 to 3.0 μm.

The anodic oxidation stage of the aluminum printing plate support material can also be followed by one or more after-treatment stages. After-treatment is here understood especially as a chemical or electrochemical treatment which renders the aluminum oxide layer hydrophilic, for example, treatment of the material by dipping in an aqueous polyvinylphosphonic acid solution according to German Pat. No. 1,621,478 (=British Pat. No. 1,230,447), treatment by dipping in an aqueous alkali metal silicate solution according to German Auslegeschrift No. 1,471,707 (=U.S. Pat. No. 3,181,461) or an electrochemical treatment (anodizing) in an aqueous alkali metal silicate solution according to German Offenlegungsschrift No. 2,532,769 (=U.S. Pat. No, 3,902,976). The purpose of these after-treatment stages is, in particular, to additionally increase the hydrophilic character of the aluminum oxide layer (although this is already adequate for many applications) while at least preserving the other properties of this layer.

In principle, there are suitable as negative-working light-sensitive reproduction layers all those layers which, after exposure with subsequent developing and, if appropriate fixing, give an imagewise area which can be used for printing and/or which represents a relief image of an original. The layers are applied to one of the customary support materials, either by the manufacturer of presensitized printing plates or of so-called dry resists, or directly by the user. In addition to the light-sensitive substances, these layers can, of course, also contain further constituents, such as, for example, resins, dyes or plasticizers. In particular, the following light-sensitive compositions or compounds can be used for coating the support materials:

(1) Negative-working condensation products of aromatic diazonium salts and compounds having active carbonyl groups, preferably condensation products of diphenylamine-diazonium salts and formaldehyde, which are described, for example, in German Pat. Nos. 596,731, 1,138,399, 1,138,400, 1,138,401, 1,142,871 and 1,154,123, U.S. Pat. Nos. 2,679,498 and 3,050,502, and British Pat. No. 712,606.

(2) Negative-working condensation products of aromatic diazonium compounds, for example, according to German Offenlegungsschrift No. 2,024,244, which contain at least one unit each of the general types $A(-D)_n$ and B, linked via a divalent bridge member derived from a carbonyl compound capable of condensation. These symbols are here defined as follows: A is the radical of a compound which contains at least two aromatic carbocylic and/or heterocyclic nuclei and which, in an acid medium, is capable of condensation with an active carbonyl compound in at least one position. D is a diazonium salt group bonded to an aromatic carbon atom of A; n is an integer from 1 to 10; and B is the radical of a compound which is free from diazonium groups and which, in an acid medium, is capable of condensation with an active carbonyl compound in at least one position of the molecule.

(3) Negative-working layers of photopolymerizable monomers, photoinitiators, binders and, if appropriate, further additives. The monomers used here are, for example, acrylates and methacrylates or reaction products of diisocyanates with partial esters of polyhydric alcohols, as described, for example, in U.S. Pats. Nos. 2,760,863 and 3,060,023 and German Offenlegungsschriften Nos. 2,064,079 and 2,361,041. Suitable photoinitiators are, inter alia, benzoin, benzoin ethers, polynuclear quinones, acridine derivatives, phenazine derivatives, quinoxaline derivatives, quinazoline derivatives or synergistic mixtures thereof.

(4) Negative-working layers according to German Offenlegungsschrift No. 3,036,077, which contain, as the light-sensitive compound, a diazonium salt polycondensation product or an organic azido compound and, as the binder, a high-molecular weight polymer with alkenylsulfonylurethane or cycloalkenylsulfonylurethane side groups.

In the examples, which follow, percent data relate to weight percent, unless otherwise stated. Parts by weight have the same relationship to parts by volume as the g to the $cm^3$.

EXAMPLE 1 and COMPARISON EXAMPLES V 1 and V 2

An electrochemically roughened and anodically oxidized aluminum support is coated with the following light-sensitive solution:
2.25 parts by weight of a copolymer of styrene and maleic anhydride, having a mean molecular weight of 20,000 and an acid number of 180,
2.25 parts by weight of a polycondensation product obtained from 1 mole of 3-methoxy-diphenylamine-4-diazonium sulfate and 1 mole of 4,4'-bis-methoxymethyl-diphenyl ether, condensed in 85% $H_3PO_4$ and precipitated as the salt of mesitylene-sulfonic acid,
0.12 part by weight of Victoria Pure Blue FGA,
0.30 part by weight of phosphoric acid (85%) and
98.08 parts by weight of ethylene glycol monomethyl ether.

After drying, the layer has a weight of 1.2 $g/m^2$. After exposure under a 5 kW metal halide lamp for 25 seconds, the layer is developed with a solution of
30 parts by weight of Na salicylate,
3 parts by weight of $Na_3PO_4 . 12 H_2O$ and
64 parts by weight of water
at a pH value of about 11.5, whereupon a perfect printing form, meeting the requirements in practice, is obtained. If, instead of the stated amount of weight of Na salicylate, the Na salt of 4-hydroxybenzoic acid or of 4-aminobenzoic acid is used, a perfect printing form meeting the requirements in practice, cannot be obtained, that is to say, there is no differentiation of the non-image areas from the image areas.

EXAMPLE 2

An aluminum support, which has been electrochemically roughened, anodically oxidized and rendered hydrophilic with an aqueous polyvinylphosphonic acid solution, is provided with the following light-sensitive coating:
50.0 parts by weight of a reaction product of a polyvinyl butyral (having a molecular weight of 80,000 and containing 75% of vinyl butyral units, 1% of vinyl acetate units and 20% of vinyl alcohol units) with propenylsulfonyl isocyanate, having an acid number of 140,
16.5 parts by weight of the polycondensation product according to Example 1,
1.5 parts by weight of phosphoric acid (85%),
2.0 parts by weight of Victoria Pure Blue FGA,
1.0 part by weight of phenylazodiphenylamine and
2,500.0 parts by weight of ethylene glycol monomethyl ether.

After drying, the layer has a weight of 1.0 $g/m^2$. After exposure under a 5 kW metal halide lamp for 25 seconds, the layer is developed with a solution of
23 parts by weight of Na salicylate,
8 parts by weight of Na tetrapolyphosphate,
4 parts by weight of $Na_3PO_4 . 12 H_2O$ and
65 parts by weight of water
at a pH value of about 10.3, whereupon a perfect printing form meeting the requirements in practice is obtained.

EXAMPLE 3

The procedure followed is as indicated in Example 2, but the developing is carried out with a solution of
25.0 parts by weight of 2-chlorobenzoic acid,
6.4 parts by weight of NaOH and
68.6 parts by weight of water
at a pH value of about 10.9, whereupon a perfect printing form meeting the requirements in practice is likewise obtained.

EXAMPLE 4

The procedure followed is as indicated in Example 2, but the developing is carried out with a solution of
25.0 parts by weight of 2-aminobenzoic acid,
7.3 parts by weight of NaOH and
67.7 parts by weight of water
at a pH value of about 10.3, whereupon a perfect printing form meeting the requirements in practice is likewise obtained.

EXAMPLE 5

The procedure followed is as indicated in Example 2, but the developing is carried out with a solution of
51.0 parts by weight of salicylic acid,
15.0 parts by weight of NaOH and
34.0 parts by weight of water,
the pH value being adjusted to 12.15 with 10% aqueous NaOH solution, whereupon a perfect printing form meeting the requirements in practice is likewise obtained.

EXAMPLE 6

The procedure followed is as indicated in Example 2, but the developing is carried out with a solution of 12.0 parts by weight of Na salicylate,
4.0 parts by weight of Na tetrapolyphosphate,
3.0 parts by weight of $Na_3PO_4 \cdot 12 H_2O$,
1.0 part by weight of Na n-octyl-sulfate and
80.0 parts by weight of water
at a pH value of about 8.5, whereupon a perfect printing form meeting the requirements in practice is likewise obtained.

EXAMPLE 7

The procedure followed is as indicated in Example 2, but the developing is carried out with a solution of
25.0 parts by weight of salicylic acid and
75.0 parts by weight of water,
the pH value being adjusted to about 7.0 with ethylenediamine, whereupon a perfect printing form meeting the requirements in practice is likewise obtained.

COMPARISON EXAMPLES V 3 to V 9

The procedure followed is as indicated in Example 2, but the developing is carried out with a solution which, in place of Na salicylate, respectively contains the Na salt of 4-aminobenzoic acid (V 3), of 3-aminobenzoic acid (V 4) of 4-hydroxybenzoic acid (V 5) of 3-hydroxybenzoic acid (V 6) of 4-methoxybenzoic acid (V 7), of 2-methoxybenzoic acid (V 8) or of benzoic acid (V 9). In none of the cases is it possible to obtain a perfect printing form meeting the requirements in practice, that is to say, there is no adequate differentiation of the non-image areas from the image areas.

EXAMPLE 8

An electrochemically roughened and anodically oxidized aluminum support is provided with the following light-sensitive coating:
1.40 parts by weight of a polyester, the free OH groups of which are esterified with acrylic acid,
1.40 parts by weight of a copolymer of methyl methacrylate and methacrylic acid, having a mean molecular weight of 60,000 and an acid number of 93.7,
0.10 part by weight of 9-phenyl-acridine,
0.20 part by weight of 1,6-dihydroxyethoxy-hexane,
0.02 part by weight of Supranol Blue Gl (C.I. 50,335) and
13.00 parts by weight of ethylene glycol monomethyl ether.

After drying, the layer is exposed imagewise and developed with a solution of
50 parts by weight of Na salicylate and
50 parts by weight of water,
the pH value being adjusted to about 11.0 with 10% aqueous NaOH solution, whereupon a perfect printing form meeting the requirements in practice is obtained.

EXAMPLE 9

An aluminum support which has been electrochemically roughened, anodically oxidized and rendered hydrophilic with an aqueous polyvinylphosphonic acid solution, is provided with the following light-sensitive coating:
1.60 parts by weight of polyvinyl formal,
0.50 part by weight of the polycondensation product according to Example 1,
0.05 part by weight of $H_3PO_4$ (85%),
0.30 part by weight of Hostaperm Blue,
57.00 parts by weight of ethylene glycol monomethyl ether,
30.00 parts by weight of tetrahydrofuran and
8.00 parts by weight of butyl acetate.

After drying, the layer is exposed imagewise and developed with a solution of
21 parts by weight of Na salicylate,
8 parts by weight of Na tetrapolyphosphate,
4 parts by weight of $Na_3PO_4 \cdot 12 H_2O$ and
67 parts by weight of water
at a pH value of 7.45, whereupon a perfect printing form meeting the requirements in practice is obtained.

EXAMPLE 10

An aluminum support which has been electrochemically roughened, anodically oxidized and rendered hydrophilic with an aqueous solution of polyvinylphosphonic acid, is coated with the following light-sensitive solution:
1.0 part by weight of the polycondensation product according to Example 1,
1.8 parts by weight of an unplasticized urea resin (having a viscosity of about 6,000 mPas at 20° C. in a 65% solution in butanol/xylene, and an acid number below 3).
0.4 part by weight of crystal violet and
98.0 parts by weight of ethylene glycol monomethyl ether.

After drying, the layer is exposed imagewise for 4 seconds under a 5 kW metal halide lamp and developed with the solution according to Example 8, whereupon a perfect printing form meeting the requirements in practice is obtained.

What is claimed is:
1. A process for developing an exposed, negative-working reproduction layer which comprises a light-sensitive diazonium salt polycondensation product, comprising the steps of
    (1) imagewise exposing to actinic radiation a negative-working reproduction layer comprising a light-sensitive diazonium salt polycondensation product, whereby said reproduction layer is comprised of exposed and unexposed portions; then
    (2) treating said reproduction layer with an organic solvent-free developer composition comprising water and from about 5% to 60% by weight, based on the total of all components in said developer composition, of at least one salt of a substituted aromatic carboxylic acid, wherein:
        (a) the substituents of said substituted aromatic carboxylic acid are immediately adjacent to a carboxyl group and are selected from the group consisting of an amino group, a hydroxyl group, a chlorine, and a bromine; and
        (b) cation of said salt of a substituted aromatic carboxylic acid is selected from the group consisting of $Na^+$ ion, $NH_4^+$ ion, $K^+$ ion, and cation derived from an organic amine,
    such that unexposed portions of said reproduction layer are dissolved.
2. A process as claimed in claim 1, wherein said reproduction layer comprises a polymeric organic binder having an acetal group, an anhydride group, an amide group and/or a carboxyl group.
3. A process as claimed in claim 1, wherein said developed composition contains from about 10% to about 30% by weight of said salt of an aromatic carboxylic acid.
4. A process as claimed in claim 1, wherein said salt of a substituted aromatic carboxylic acid is selected from the group consisting of 2-hydroxy-benzoic acid, 2- amino-benzoic acid, 2-chloro-benzoic acid, 2-6-dihydroxybenzoic acid, and 2-hydroxy-naphthalene-3-carboxylic acid.

5. A process as claimed in claim 1, wherein said developer composition further comprises from about 0.01% to about 10% by weight of an anionic surfactant.

6. A process as claimed in claim 1, wherein said reproduction layer further comprises an organic binder.

7. A process as claimed in claim 1, wherein said reproduction layer comprises a polymeric organic binder having an acetal, anhydride, amide and/or a carboxyl group.

8. A process as claimed in claim 7, wherein said polymeric binder is selected from the group consisting of a copolymer of styrene and maleic anhydride, a polyvinyl butyral, a polyvinyl formal, a reaction product of a polymeric polyhydroxyl compound and a sulfonyl isocyanate, a copolymer of methyl methacrylate and methacrylic acid, and a urea resin.

9. A process as claimed in claim 1, wherein the pH value of said developer composition ranges between about 7 and about 13.

10. A process as claimed in claim 9, wherein said pH value ranges between about 7 and about 11.

11. A process as claimed in claim 1, wherein said reproduction layer is a light-sensitive layer of an offset printing plate having a substrate comprising aluminum or an aluminum alloy.

12. A process as claimed in claim 11, wherein said substrate is roughened electrochemically and then subjected to anodic oxidation.

* * * * *